(12) United States Patent
Burke et al.

(10) Patent No.: US 11,437,507 B2
(45) Date of Patent: Sep. 6, 2022

(54) SEMICONDUCTOR DEVICES WITH LOW RESISTANCE GATE AND SHIELD ELECTRODES AND METHODS

(71) Applicant: SEMICONDUCTOR COMPONENTS INDUSTRIES, LLC, Phoenix, AZ (US)

(72) Inventors: Peter A. Burke, Portland, OR (US); Mitsuru Soma, Higashimatsuyama (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 14 days.

(21) Appl. No.: 17/060,280

(22) Filed: Oct. 1, 2020

(65) Prior Publication Data

US 2022/0045206 A1 Feb. 10, 2022

Related U.S. Application Data

(60) Provisional application No. 62/706,166, filed on Aug. 4, 2020.

(51) Int. Cl.
*H01L 29/78* (2006.01)
*H01L 29/10* (2006.01)
*H01L 29/66* (2006.01)
*H01L 29/40* (2006.01)
*H01L 21/765* (2006.01)

(52) U.S. Cl.
CPC ........ *H01L 29/7813* (2013.01); *H01L 21/765* (2013.01); *H01L 29/1095* (2013.01); *H01L 29/407* (2013.01); *H01L 29/408* (2013.01); *H01L 29/66734* (2013.01)

(58) Field of Classification Search
CPC .......... H01L 29/7813; H01L 29/66734; H01L 29/407; H01L 29/408
See application file for complete search history.

(56) References Cited

U.S. PATENT DOCUMENTS

| | | | | |
|---|---|---|---|---|
| 7,897,462 B2 * | 3/2011 | Burke | ................... | H01L 29/407 438/270 |
| 8,796,764 B2 * | 8/2014 | Blank | ................. | H01L 29/4236 257/E29.257 |
| 10,153,357 B1 * | 12/2018 | Qin | ..................... | H01L 29/7825 |
| 10,304,933 B1 * | 5/2019 | Woo | .................... | H01L 21/3212 |

(Continued)

*Primary Examiner* — Joseph C. Nicely
(74) *Attorney, Agent, or Firm* — Kevin B. Jackson

(57) ABSTRACT

A semiconductor device includes a region of semiconductor material and a trench gate structure. The trench gate structure includes an active trench, a shield dielectric layer in a lower portion of the active trench, and a shield electrode of a first polycrystalline semiconductor material adjacent to the shield dielectric layer. A gate dielectric layer is adjacent to an upper portion of the active trench and a gate electrode of a second polycrystalline semiconductor material is adjacent to the gate dielectric layer. A shield conductive layer of a first conductive material is adjacent to the shield electrode and a gate conductive layer of the first conductive material is adjacent to the gate electrode. A dielectric fill structure is in the active trench electrically isolating the gate electrode and the gate conductive layer from the shield electrode and the shield conductive layer. In some examples, the semiconductor device includes a trench shield contact structure that includes the shield conductive layer.

20 Claims, 7 Drawing Sheets

(56) References Cited

U.S. PATENT DOCUMENTS

| | | | |
|---|---|---|---|
| 11,257,944 B2* | 2/2022 | Okada | H01L 29/41766 |
| 2003/0218209 A1 | 11/2003 | D'Anna et al. | |
| 2010/0078718 A1* | 4/2010 | Blank | H01L 29/407 |
| | | | 257/E21.177 |
| 2010/0123192 A1* | 5/2010 | Burke | H01L 29/407 |
| | | | 257/334 |
| 2010/0123193 A1* | 5/2010 | Burke | H01L 21/823487 |
| | | | 257/334 |
| 2010/0163988 A1* | 7/2010 | Chow | H01L 29/66704 |
| | | | 438/296 |
| 2011/0133258 A1* | 6/2011 | Chen | H01L 29/0847 |
| | | | 257/E21.409 |
| 2012/0199899 A1* | 8/2012 | Kobayashi | H01L 29/66734 |
| | | | 438/270 |
| 2013/0323921 A1* | 12/2013 | Burke | H01L 21/02211 |
| | | | 257/E21.24 |
| 2020/0212218 A1* | 7/2020 | Kim | H01L 29/1095 |
| 2021/0202704 A1* | 7/2021 | Kishimoto | H01L 29/7813 |
| 2021/0202736 A1* | 7/2021 | Nishiguchi | H01L 29/0649 |
| 2021/0320202 A1* | 10/2021 | Hsieh | H01L 29/7813 |
| 2021/0384346 A1* | 12/2021 | Hsieh | H01L 29/0634 |
| 2022/0045206 A1* | 2/2022 | Burke | H01L 29/7813 |

* cited by examiner

SEMICONDUCTOR DEVICES WITH LOW RESISTANCE GATE AND SHIELD ELECTRODES AND METHODS

CROSS-REFERENCE TO RELATED APPLICATIONS

This application claims the benefit of U.S. Provisional Patent Application No. 62/706,166, filed on Aug. 4, 2020, the entire contents of which is incorporated herein by reference.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, decreased reliability, relatively low performance including poor switching performance, or dimensions that are too large. Further limitations and disadvantages of conventional and traditional approaches will become apparent to one of skill in the art, through comparison of such approaches with the present disclosure and reference to the drawings.

Figure 1:
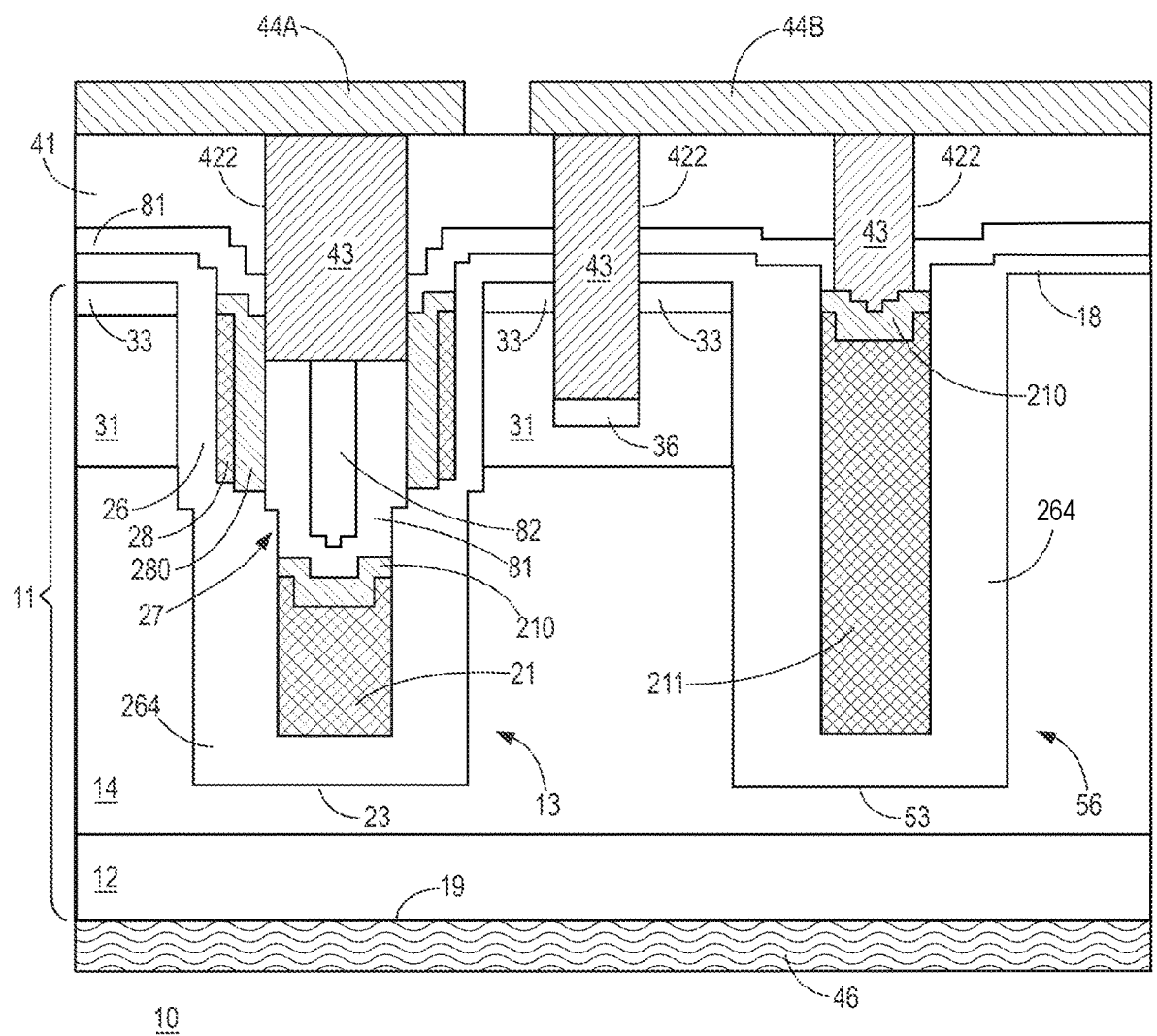
FIG. 1 illustrates a partial cross-sectional view of a semiconductor device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

Insulated gate field effect transistor (IGFET) devices are widely used in power applications. A trench metal-oxide-semiconductor FET (MOSFET) device is a type of IGFET device used in switching power circuits, such as step down circuits. Certain trench MOSFET devices include a shield electrode electrically isolated from a gate electrode within the same trench. These device designs are limited for efficiency at higher frequencies by shield conductor and gate conductor resistances including feed portions that connect respective contact pads to the shield electrodes and gate electrodes in the trenches. The shield conductor and gate conductor resistances also limit response time for driver inputs for the trench MOSFET device.

In general, the present examples relate to semiconductor device structures and methods of making semiconductor devices that have reduced shield and gate resistances, which improves, among other things, switching performance and response time for driver inputs into the semiconductor device. In addition, the structures and methods provide for the shield electrode resistance and the gate electrode resistance to be more closely matched. In some examples, the shield electrode and the gate electrode comprise a polycrystalline semiconductor material, such as doped polysilicon, and a conductor is provided on both the shield electrode and the gate electrode at the same time. In some examples, the conductor is disposed along opposing sidewall surfaces of the gate electrode and along an upper surface of the shield electrode. In some examples, the conductor comprises a silicide structure. In other examples, the conductor comprises a metal, such as a metal nitride. In some examples, a gate dielectric layer is provided prior to providing the shield electrode and the gate electrode, which preserves the integrity of the semiconductor/gate dielectric interface. In other examples, spacer structures are used to separate the shield portion of the conductor from the gate portion. The structures and methods use materials and processes that are compatible in typical semiconductor wafer fabrication facilities and are manufacturable at low costs. In some examples, the shield conductor extends a continuous conductive layer to a shield contact trench to further reduce shield electrode resistance.

More particularly, in an example, a semiconductor device includes a region of semiconductor material comprising a first major surface, a first conductivity type, and a trench gate structure. The trench gate structure includes an active trench extending from the first major surface into the region of semiconductor material; a shield dielectric layer in a lower portion of the active trench; a shield electrode adjacent to the shield dielectric layer in the lower portion of the active trench, the shield electrode comprising a first polycrystalline semiconductor material; a gate dielectric layer in an upper portion of the active trench; a gate electrode adjacent to the gate dielectric layer in the upper portion of the active trench, the gate electrode comprising a second polycrystalline semiconductor material; a shield conductive layer adjacent to the shield electrode, the shield conductive layer comprising a first conductive material; a gate conductive layer adjacent to the gate electrode, the gate conductive layer comprising the first conductive material; and a dielectric fill structure in the active trench electrically isolating the gate electrode and the gate conductive layer from the shield electrode and the shield conductive layer. A body region of a second conductivity type opposite to the first conductive type is in the region of semiconductor material extending from the major surface adjacent to the trench gate structure. A source region of the first conductivity type is in the body region adjacent to the trench gate structure.

In an example, a semiconductor device includes a region of semiconductor material comprising a first major surface and a first conductivity type and a trench gate structure. The trench gate structure includes an active trench extending from the first major surface into the region of semiconductor material; a shield dielectric layer adjacent to a lower portion of the active trench; a shield electrode adjacent to the shield dielectric layer in the lower portion of the active trench, the shield electrode comprising a first polycrystalline semiconductor material; a gate dielectric layer adjacent to an upper portion of the active trench; a gate electrode adjacent to the gate dielectric layer in the upper portion of the active trench, the gate electrode comprising a second polycrystalline semiconductor material; a shield conductive layer adjacent to the shield electrode, the shield conductive layer comprising a first material, such as one or more of a metal material or a silicide material; a gate conductive layer adjacent to the gate electrode, the gate conductive layer comprising the first material; and a dielectric fill structure in the active trench electrically isolating the gate electrode and the gate conductive layer from the shield electrode and the shield conductive layer. A body region of a second conductivity type opposite to the first conductive type is in the region of semiconductor material extending from the major surface adjacent to the trench gate structure. A source region of the first conductivity type is in the body region adjacent to the trench gate structure. The metal material can include metal-nitride materials.

In an example, a method of forming a semiconductor device includes providing a region of semiconductor material comprising a first major surface and a first conductivity type. The method includes providing a trench gate structure having an active trench extending from the first major surface into the region of semiconductor material, a shield dielectric layer adjacent to a lower portion of the active trench, a shield electrode adjacent to the shield dielectric layer, the shield electrode comprising a first polycrystalline semiconductor material, a gate dielectric layer adjacent to an upper portion of the active trench, a gate electrode comprising a second polycrystalline semiconductor material adjacent to the gate dielectric layer, a shield conductive layer comprising a first material, such as one or more of a metal material or a silicide material adjacent to the shield electrode, a gate conductive layer comprising the first silicide material adjacent to the gate electrode, and a dielectric fill structure in the active trench electrically isolating the gate electrode and the gate conductive layer from the shield electrode and the shield conductive layer. The method includes providing a body region of a second conductivity type opposite to the first conductive type in the region of semiconductor material extending from the major surface adjacent to the trench gate structure. The method includes providing a source region of the first conductivity type in the body region adjacent to the trench gate structure. The metal material can include metal-nitride materials.

FIG. 1 illustrates an enlarged partial cross-sectional view of an electronic device 10, a semiconductor device 10, or a trench MOSFET 10 having a trench gate structure 13 in accordance with the present description. In some examples, trench gate structure 13 can be placed in an active region of semiconductor device 10. FIG. 1 also illustrates semiconductor device 10 with a shield contact structure 56, which can be placed in the active region and/or a peripheral region of semiconductor device 10. In some examples, semiconductor device 10 comprises a region of semiconductor material 11 having a major surface 18 and an opposing major surface 19. Region of semiconductor material 11 can include a bulk semiconductor substrate 12, such as an N-type conductivity silicon substrate having a resistivity in a range from about 0.001 ohm-cm to about 0.005 ohm-cm. By way of example, substrate 12 can be doped with phosphorous, arsenic, or antimony. In the example illustrated, substrate 12 provides a drain region, drain contact, or a first current carrying contact for device 10. In the present example, semiconductor device 10 is configured at a vertical MOSFET structure, but this description applies as well to insulated gate bipolar transistors (IGBT), MOS-gated thyristors, and other related or equivalent structures as known to one of ordinary skill in the art.

In some examples, region of semiconductor material 11 further includes a semiconductor layer 14, doped region 14, doped layer 14, or doped layers 14, which can be formed in, on, or overlying substrate 12. In one example, semiconductor layer 14 can be an N-type conductivity region or layer when substrate 12 is N-type conductivity, and can be formed using epitaxial growth techniques, ion implantation and diffusion techniques, or other techniques as known to one of ordinary skill in the art. In one example, semiconductor layer 14 includes major surface 18 of region of semiconductor material 11. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to one of ordinary skill in the art.

In some examples, semiconductor layer 14 has a dopant concentration that is less than the dopant concentration of substrate 12. The dopant concentrations and thicknesses of semiconductor layer 14 can be increased or decreased depending, for example, on the desired breakdown ($BV_{DSS}$) rating and layout design of semiconductor device 10. In some examples, semiconductor layer 14 can have a dopant profile that changes over its depth inward from major surface 18. Such changes can include linear and non-linear profiles over the thickness of semiconductor layer 14.

In the present example, trench gate structure 13 includes an active trench 23 extending from major surface 18 of region of semiconductor material 11 inward to a depth within semiconductor layer 14. Trench gate structure 13 further includes a shield electrode 21, a shield dielectric layer 264 separating shield electrode 21 from semiconductor layer 14, a shield conductive layer 210 connected to shield electrode 21, gate dielectric layers 26 over upper surfaces of active trench 23, gate electrodes 28 disposed adjacent to gate dielectric layers 26, gate conductive layers 280 disposed adjacent to gate electrodes 28, and a dielectric fill structure 27 electrically isolating shield electrode 21 and shield conductive layer 21 from gate electrodes 28 and gate conductive layers 280. As will be described in more detail layer, dielectric fill structure 27 can comprise one or more layers of dielectric materials having different etch selectivity. By way of example, dielectric fill structure 27 can comprise a first dielectric layer 81 and a second dielectric layer 82. As illustrated in FIG. 1, in some examples dielectric layer 81 is also provided overlying portions of major surface 18.

In some examples, shield electrode 21 and gate electrodes 28 comprise doped polycrystalline semiconductor material, such as doped polysilicon. In some examples, the polysilicon is doped with an N-type conductivity dopant, such as phosphorous or arsenic. In other examples, the polysilicon can be doped with a P-type conductivity dopant, such as boron. In accordance with the present description, gate electrodes 28 are separated portions, such as spacer structures as illustrated in the cross-sectional view of FIG. 1, which do not fill active trench 23. Instead, gate electrodes 28 are separated by dielectric fill structure 27. Stated a different way, gate electrodes 28 line gate dielectric layers 26 in upper portions of active trench 23.

In accordance with the present description, shield conductive layer 210 and gate conductive layers 280 are provided to reduce the resistance of shield electrode 21 and gate electrodes 28. In some examples, and as will be described in more detail later, shield conductive layer 210 and gate conductive layers 280 can be formed at the same time, and may comprise the same materials, such as one or more metals, metal-nitrides, silicides, or other conductive material(s) as known to one of ordinary skill in the art. In this regard, the resistances of gate electrodes 28 and shield electrode 21 can be more closely matched, and additional processing steps can be minimized compared to forming shield conductive layer 210 and gate conductive layers 280 with separate processing steps. In some examples, shield conductive layer 210 and gate conductive layers 280 comprise tungsten (W) silicide, cobalt (Co) silicide, titanium (Ti) silicide, or other silicides as known to one of ordinary skill in the art. In some examples, shield conductive layer 210 and gate conductive layers 280 comprise titanium-nitride (TiN). In other examples, shield conductive layer 210 and gate conductive layers 280 comprise a combination of polycrystalline semiconductor material (e.g., polysilicon) and a metal or metal-nitride.

In some examples, shield contact structure 56 comprises a contact trench 53 extending from major surface of region of semiconductor material 11 inward to a depth within semiconductor layer 14. In some examples, contact trench 53 can have a similar depth to active trench 23, and can have a similar or different width to active trench 23. In some examples, shield contact structure 56 comprises a shield contact layer 211 separated from semiconductor layer 14 by shield dielectric layer 264. Shield contact layer 211 is electrically connected to shield electrode 21. In accordance with the present description, shield conductive layer 210 is further provided to be electrically connected to shield contact layer 211. More particularly, shield conductive layer 210 extends between active trench 23 and contact trench 53 as a continuous layer to further reduce the resistance of shield electrode 21. Shield electrode 21, shield conductive layer 210, and shield contact layer 211 are electrically isolated from gate conductive layers 280 and gate electrodes 28, which can be done using, for example, a patterned etch process.

In some examples, semiconductor device 10 further comprises a body region 31, which in the present example comprises a P-type conductivity, and is disposed adjacent to trench gate structure 13 as generally illustrated in FIG. 1. Body region 31 can be a plurality of individual doped regions, or can be a continuous interconnected doped region. Body regions 31 have a dopant concentration suitable for forming inversion layers that operate as conduction channels or channel regions for semiconductor device 10 when an appropriate bias voltage is applied to gate electrodes 28. Body regions 31 can extend from major surface 18 to a depth, for example, from about 0.7 microns to about 1.0 microns. Body regions 31 can be formed using doping techniques, such as ion implantation and anneal techniques. Body regions 31 can also be referred to base regions or PHV regions.

In some examples, source regions 33 can be formed within, in, or overlying body regions 31 and can extend from major surface 18 to a depth for example, from about 0.2 microns to about 0.4 microns. In some examples, source regions 33 can have N-type conductivity and can be formed using, for example, a phosphorous or arsenic dopant source. Source regions 33 can also be referred to current conducting regions or current carrying regions.

In some examples, an ILD structure 41 can be formed overlying major surface 18. In one embodiment, ILD structure 41 comprises one or more dielectric or insulative layers. ILD structure 41 can be planarized to provide a more uniform surface topography, which improves manufacturability.

In some examples, conductive regions 43 can be formed within contact openings 422 or contact vias 422 and configured to provide electrical contact to source regions 33 and body regions 31 through contact regions 36, and to provide electrical contact to gate electrodes 28 and shield contact layer 211. In some examples, conductive regions 43 can be conductive plugs or plug structures. In some examples, conductive regions 43 can include a conductive barrier structure or liner and a conductive fill material. In some examples, the barrier structure can include a metal/metal-nitride configuration, such as titanium/titanium-nitride or other related or equivalent materials as known by one of ordinary skill in the art. In other examples, the barrier structure can further include a metal-silicide structure. In some examples, the conductive fill material includes tungsten. In some examples, conductive regions 43 can be planarized to provide a more uniform surface topography.

Conductive layers 44A and 44B can be formed overlying major surface 18, and a conductive layer 46 can be formed overlying major surface 19. Conductive layers 44A, 44B and 46 can be configured to provide electrical connection between the individual device components of semiconductor device 10 and a next level of assembly. In some examples, conductive layers 44A and 44B can be titanium/titanium-nitride/aluminum-copper or other related or equivalent materials known by one of ordinary skill in the art. Conductive layers 44A and 44B are configured as an external gate electrode and an external source electrode respectively. FIG. 1 illustrates an example where shield electrodes 21 and source regions 33 are electrically connected together through conductive layer 44B to be at the same potential when device semiconductor 10 is in use. In other examples, shield electrodes 21 can be configured to be independently biased or coupled in part to gate electrodes 28.

In some examples, conductive layer 46 can be a solderable metal structure such as titanium-nickel-silver, chromium-nickel-gold, or other related or equivalent materials known by one of ordinary skill in the art and is configured as a drain electrode or terminal. In some examples, a further passivation layer (not shown) can be formed overlying conductive layers 44A and 44B. It is further understood that additional conductive layers can be included above conductive layers 44A and 44B separated by an additional ILD layer(s).

In accordance with the present example, semiconductor device 10 is an improvement over previous devices because additional conductive layers (i.e., gate conductive layer 280 and shield conductive layer 210) are provided over both the gate electrode and the shield electrode to reduce resistance and to provide better resistance matching between the gate electrode and the shield electrode. In this way, switching efficiency is improved and dead time for input drivers is reduced. In addition, semiconductor device 10 has lower capacitance because fewer gate and shield feeds are needed because of the reduced resistance. This further increases area for the active devices or reduces die size. This is beneficial for many applications where reduced power consumption becomes important, including, for example, cloud computing.

Turning now to FIGS. 2 through 9, a method of manufacturing a semiconductor device, such as semiconductor device 10 is described.

Figure 2:
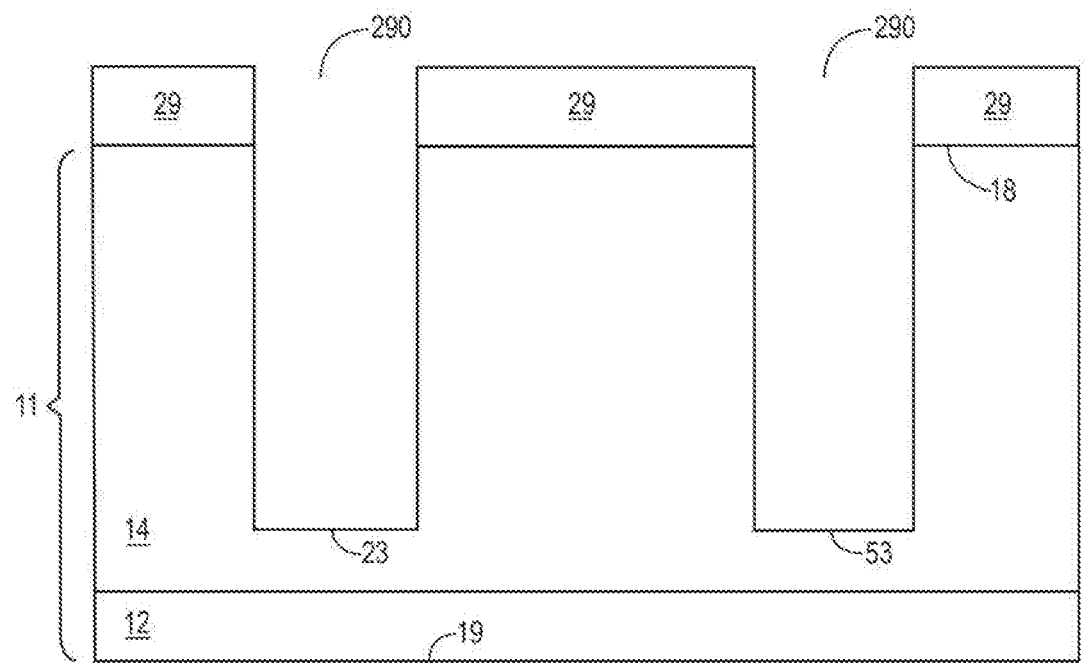
FIGS. 2-9 illustrate partial cross-sectional views of the semiconductor device of FIG. 1 at various stages of fabrication in accordance with the present description.

FIG. 2 illustrates a partial cross-sectional view of semiconductor device 10 at an early stage of fabrication in accordance with the present example. Region of semiconductor material 11 can be provided as a semiconductor substrate or wafer, or another form of work piece. Region of semiconductor material 11 can be cleaned, and then a dielectric structure 29 formed over major surface 18. In some examples, dielectric structure 29 can comprise one or more layers of dielectric materials, such thermal oxide, deposited nitrides, deposited oxides, or combination thereof. A masking step can then be used to form openings 290 in dielectric structure 29. A removal step, such as an etch step is then used to form active trench 23 and contact trench 53 extending inward from major surface 18 into region of semiconductor material 11. By way of example, trenches 23 and 53 can be etched using plasma etching techniques with a fluorocarbon chemistry or a fluorinated chemistry (for example, $SF_6/O_2$) or other chemistries or removal techniques as known to those of ordinary skill in the art. In some examples, active trench 23 and contact trench 53 have a depth in a range from about 0.5 microns to about 9 microns. After the trenches are formed, the exposed surfaces of the trenches can be cleaned using, for example, a buffered hydrofluoric acid (HF) clean. In some examples, dielectric structure 29 or portions thereof can then be removed.

Figure 3:
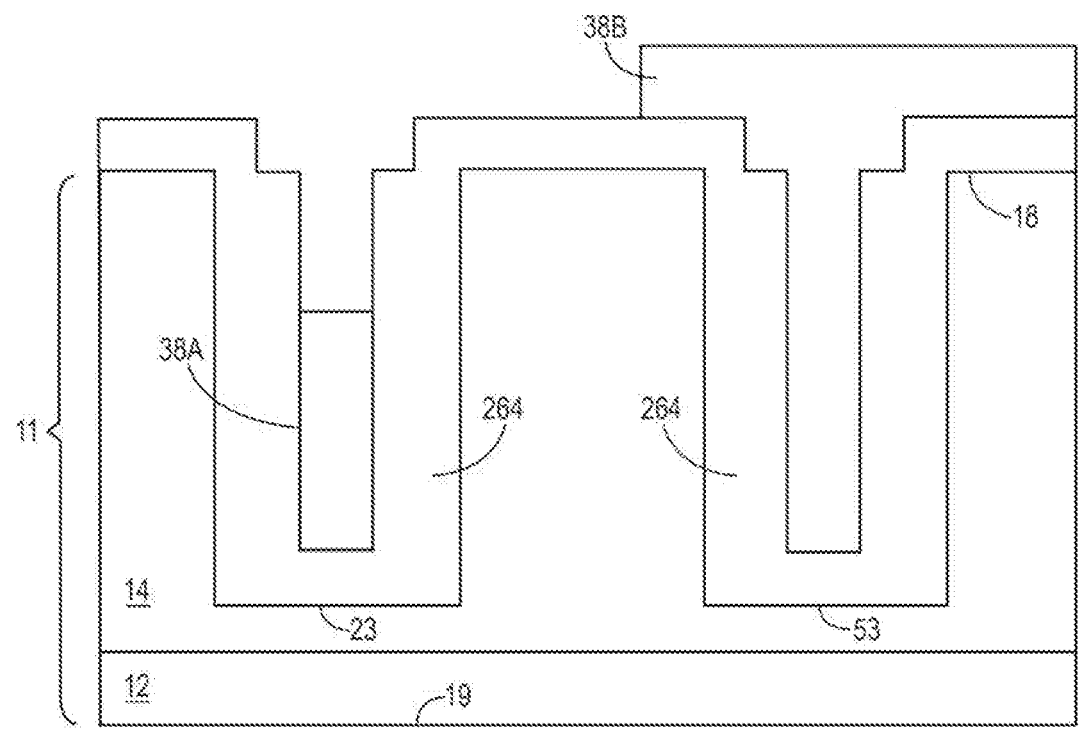

FIG. 3 illustrates a partial cross-sectional view of semiconductor device 10 after additional processing in accordance with the present example. Shield dielectric layer 264 is provided along surfaces of active trench 23 and contact trench 53. In some examples, shield dielectric layer 264 comprises a thermal oxide having a thickness in a range from about 800 Angstroms to about 1050 Angstroms. The thickness of shield dielectric layer can be adjusted depending on the electrical requirements of semiconductor device. For example, the thickness can increase for higher voltage devices including a thickness of about 4000 Angstroms. In other examples, shield dielectric layer 264 can comprise more than one dielectric materials, such as oxides, nitrides, combination thereof, or other dielectric materials as known to one of ordinary skill in the art. Next, a mask layer, such as a photoresist layer is provided over shield dielectric 264 and patterned to provide a mask portion 38A recessed within active trench 23 below major surface 18, and a mask portion 38B overlying major surface 18 and contact trench 53. Mask portion 38B protects shield dielectric layer 264 within contact trench 53 during subsequent processing.

Figure 4:
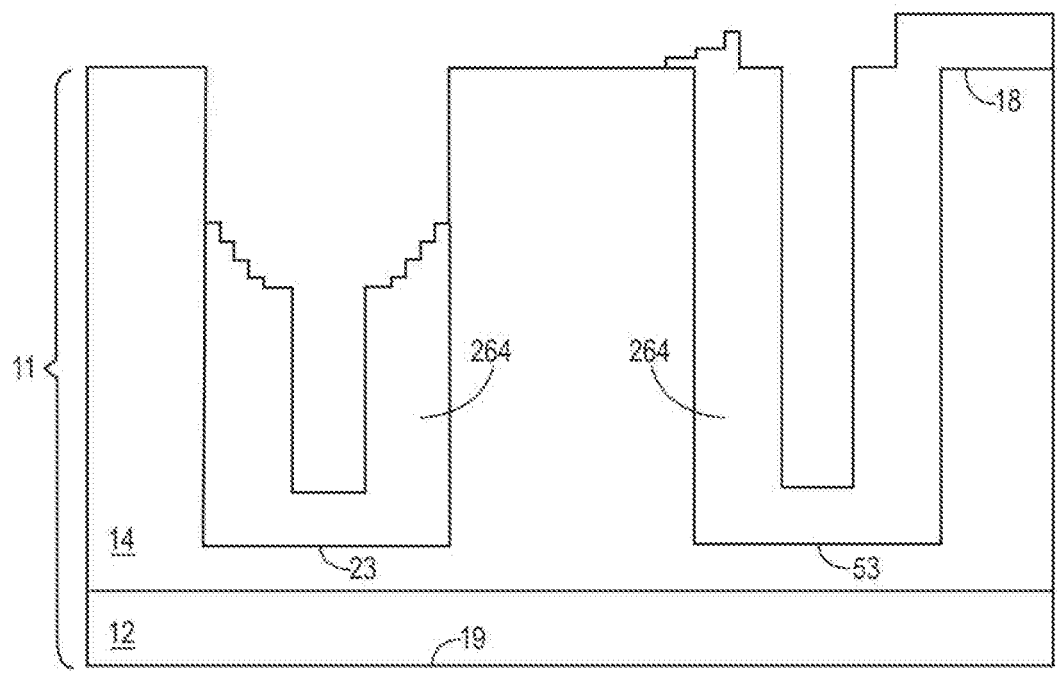

FIG. 4 illustrates a partial cross-sectional view of semiconductor device 10 after further processing. In some examples, portions of shield dielectric layer 264 are removed from upper surfaces of active trench 23 and from portions of major surface 18 proximate to active trench 23. In some examples, a buffered HF etch is used to remove portions of shield dielectric layer 264 when shield dielectric layer 264 comprises an oxide. Other removal techniques can be used and selected in accordance with the material(s) used for shield dielectric layer 264. After portions of shield dielectric layer 264 are removed, mask portions 38A and 38B can be removed as illustrated in FIG. 4.

This step can be used to set the height or dimensions of the channel region for semiconductor device 10.

Figure 5:
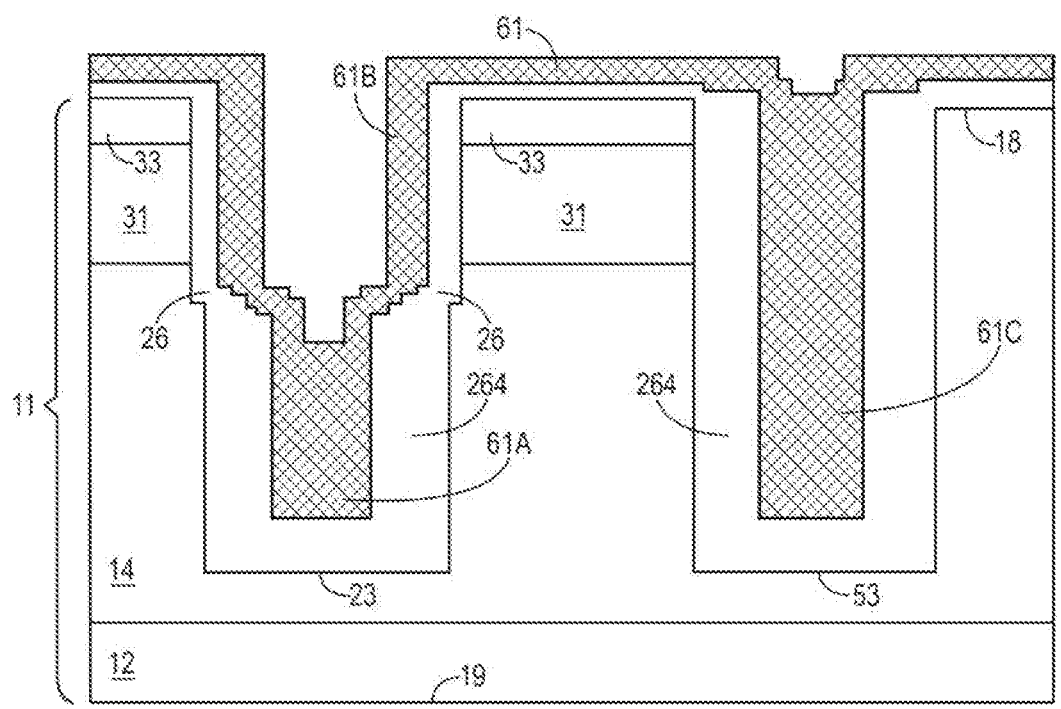

FIG. 5 illustrates a partial cross-sectional view of semiconductor device 10 after further processing. In some examples, the exposed sidewall surfaces of active trench 23 are cleaned and gate dielectric layer 26 is then formed as illustrated in FIG. 5. Gate dielectric layer 26 can comprise oxides, nitrides, tantalum pentoxide, titanium dioxide, barium strontium titanate, high k dielectric materials, combinations thereof, or other related or equivalent materials known by one of ordinary skill in the art. In some examples, gate dielectric layer 26 comprises a thermal oxide having a thickness in a range from about 100 Angstroms to about 1000 Angstroms. In some examples, a high temperature oxide (HTO) layer (not shown) can be formed over gate dielectric layer 26, which can have a thickness in range from about 75 Angstroms to about 150 Angstroms.

Figure 6:
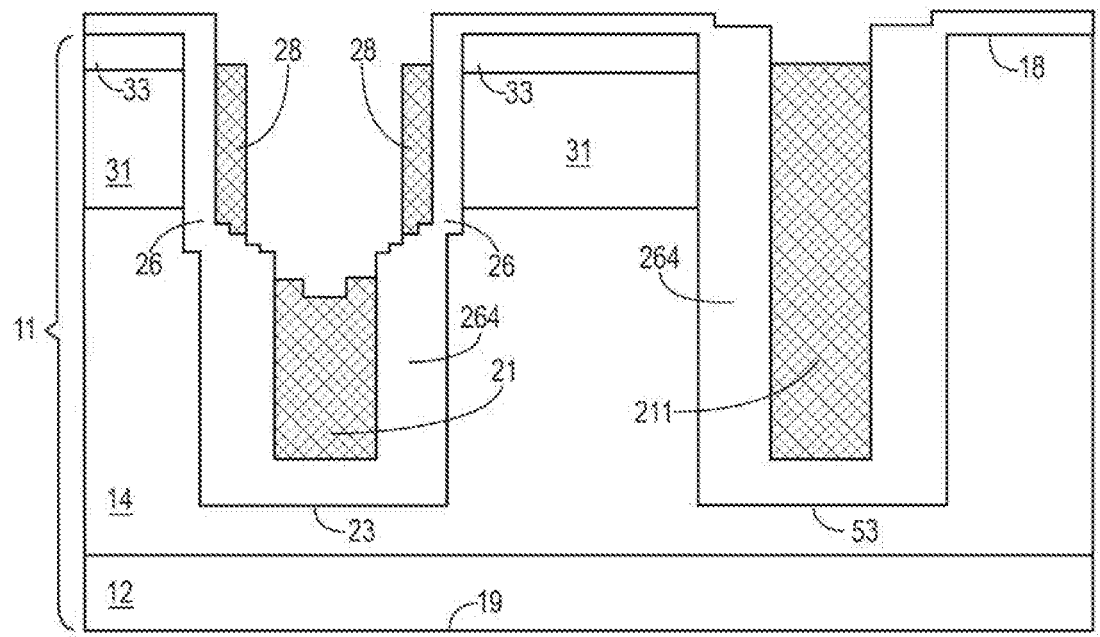

Next, in some examples a layer of material 61, such as a polycrystalline semiconductor layer 61 is provided overlying semiconductor device 10 including within active trench 23 and contact trench 53. In some examples, polycrystalline semiconductor layer 61 comprises polysilicon, which can be doped with an N-type conductivity dopant either in-situ or after polycrystalline semiconductor layer 61 is formed. By way of example, chemical vapor deposition (CVD) techniques can be used to form polycrystalline semiconductor layer 61. It is understood that other deposition techniques, such as plasma-enhanced CVD (PECVD), can be used as known to one of ordinary skill in the art. In accordance with the present description, because of the difference in thickness between gate dielectric layer 26 and shield dielectric layer 264, polycrystalline semiconductor layer 61 fills the lower portion of active trench 23 adjacent to shield dielectric layer 264 (designated as portion 61A), lines (i.e., does not fill so as to provide a gap) the upper portion of active trench 23 adjacent to gate dielectric layer 26 (designated as portion 61B), and fills contact trench 53 adjacent to shield dielectric layer 264 (designated as portion 61C) as generally illustrated in FIG. 6. In some examples, polycrystalline semiconductor layer 61 has a thickness in range from about 400 Angstroms to about 700 Angstroms. This thickness can be adjusted depending on the gap distances between shield dielectric 264 in active trench 23 and contact trench 53. In other examples, layer of material 61 can comprise a metal, a metalloid, other conductive materials as known to one of ordinary skill in the art, or combinations thereof. In some examples, layer 61 comprises materials that can be deposited in a conformal manner by CVD, metal-organic CVD (MOCVD), or atomic layer deposition (ALD). Other materials for layer 61 can include, for example, tungsten (W), titanium-nitride (TiN), tantalum (Ta), tantalum-nitride (TaN), or palladium (Pd). It is understood that layer of material 61 can include a laminate structure that comprise more than one sub-layer of material.

FIG. 5 further illustrates semiconductor device 10 after the formation of body regions 31 and source regions 33, which may be formed after the formation of polycrystalline semiconductor layer 61. It is understood that body regions 31 and source regions 33 can be formed earlier or later in the process sequence. In some examples, photo-masking steps can be used to provide the desired patterns for body regions 31 and source regions 33, and ion implantation and anneal processes can be used form these doped regions as known to one of ordinary skill in the art. It is understood that when one or more metals are used in layer 61, body regions 31 and sources regions are formed prior to forming layer 61.

FIG. 6 illustrates a partial cross-sectional view of semiconductor device 10 after additional processing. In some examples, an anisotropic etch is used to remove portions of polycrystalline semiconductor layer 61 to provide shield electrode 21, gate electrodes 28, and shield contact layer 211. In some examples, gate electrodes 28 and shield contact layer 211 are recessed below major surface a distance in a range from about 750 Angstroms to about 1250 Angstroms. In some examples, a dry etch process is used with a chemistry having a high selectivity to etch polycrystalline semiconductor layer 61 at higher rate than gate dielectric layer 26 and shield dielectric layer 264. In some examples, a chlorine (Cl), bromine (HBr) based chemistries, or combinations thereof can be used. In some examples, a thin oxide can be formed on shield electrode 21, gate electrodes 28, and shield contact layer 211, and then stripped as a way to clean outer surfaces of these layers prior to next steps in the process sequence. In some examples, body regions 31 and source regions 33 are formed after this step.

Figure 7:
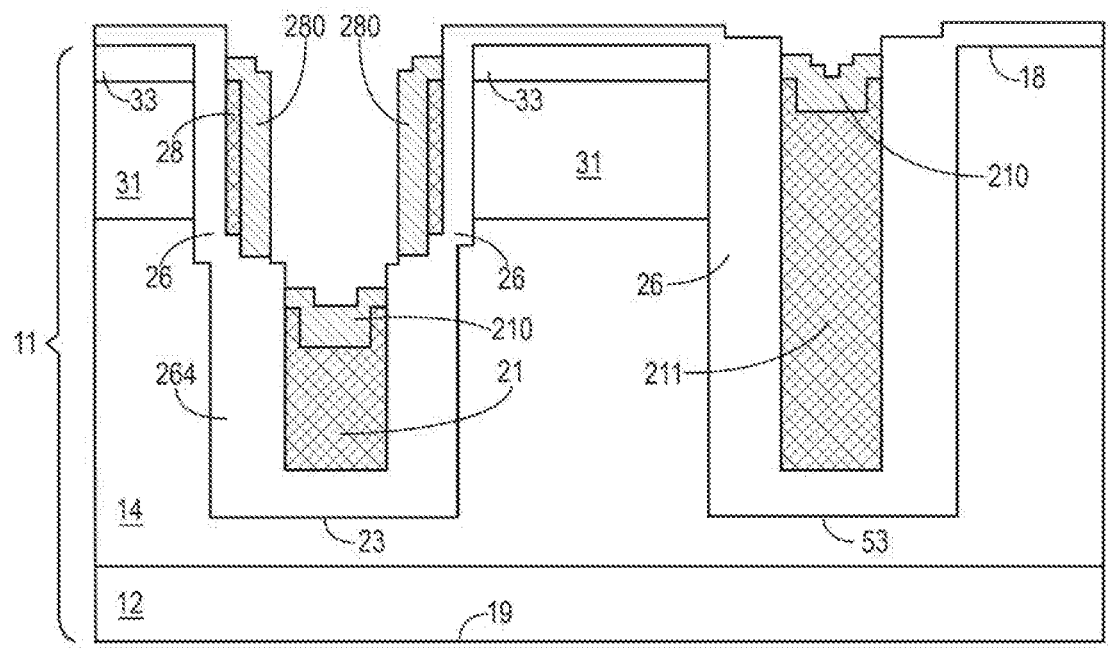

FIG. 7 illustrates a partial cross-sectional view of semiconductor device 10 after further processing. In some examples, a conductive layer is provided over semiconductor device 10 including within active trench 23 and contact trench 53. In accordance with the present description, the conductive layer comprises a material that can form a silicide with shield electrode 21, gate electrodes 28, and shield contact layer 211. In some examples, the conductive layer comprises tungsten, titanium, titanium nitride, cobalt, or other conductive materials as known to one of ordinary skill in the art. The conductive layer can be formed using evaporation, sputtering, or other deposition processes as known to one of ordinary skill in the art. In some examples, the conductive layer can fill active trench 23 and contact trench 53. In other examples, the conductive layer can line active trench 23 and fill contact trench 53. In some examples, the conductive layer has a thickness in a range from about 1000 Angstroms to about 2000 Angstroms.

After the conductive layer is formed, the conductive layer can be patterned using a photolithographic and etch step to separate the conductive layer into the desired conductive layer portions for the gate electrodes and the shield electrodes. Next, semiconductor device 10 can be exposed to an elevated temperature to form a silicide between the conductive layer and shield electrode 21, gate electrodes 28, and shield contact layer 211. In some examples, one or more rapid thermal anneal (RTA) processes at predetermined temperatures can be used to form the silicide depending on the conductive material used. Unreacted portions of the conductive layer can then be removed to provide shield conductive layers 210 and gate conductive layers 280 on shield electrode and shield contact layer 211 and gate electrodes 28 respectively. In accordance with the present description, shield conductive layers 210 and gate conductive layers 280 function to reduce gate and shield resistances in semiconductor device 10 and to provide closer matching of the gate resistance to the shield resistance to thereby improve the switching performance and response time for semiconductor device 10. Further, the present method forms both shield conductive layers 210 and gate conductive layers 280 at the same time in a single set of steps (i.e., same set of unit processes can be used), which reduces processing steps, better ensures the desired resistance matching, and improves process repeatability.

Figure 8:
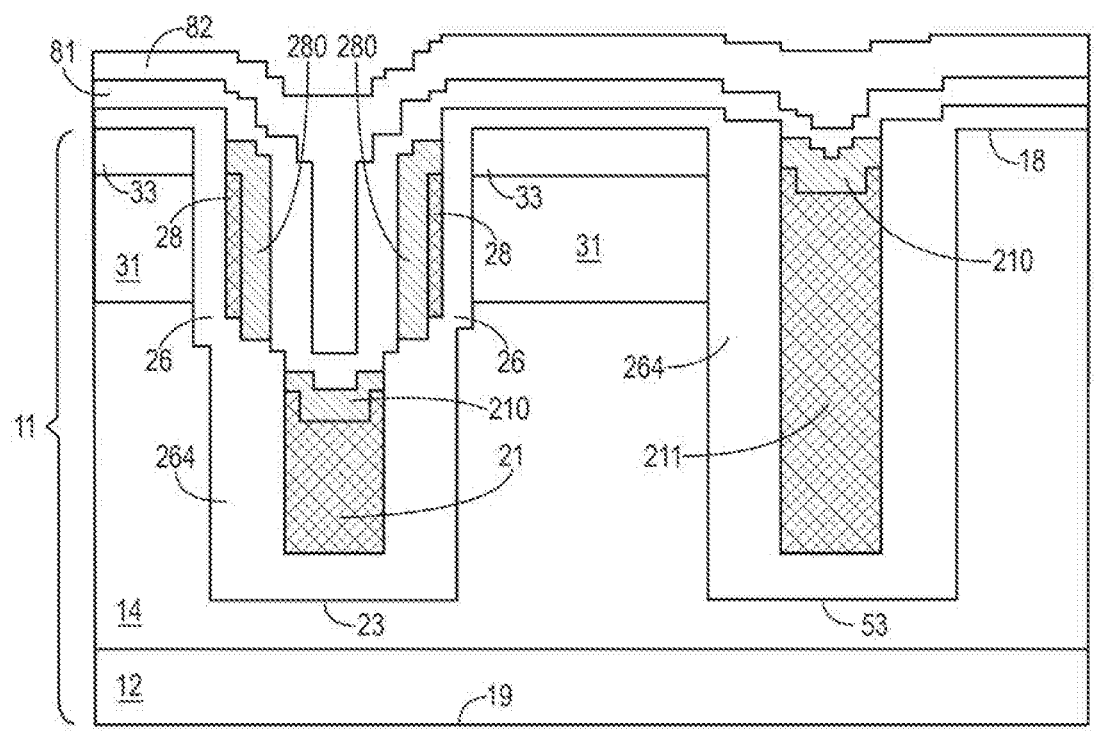

FIG. 8 illustrates a partial cross-sectional view of semiconductor device 10 after additional processing. In some examples, a first dielectric layer 81 is provided over semiconductor device 10 including within active trench 23, and a second dielectric layer 82 is provided over first dielectric layer 81. In accordance with the present example, first dielectric layer 81 comprises an undoped silicon glass (USG). In some examples, first dielectric layer 81 can be formed by CVD or similar techniques. In some examples, first dielectric layer 81 has a thickness in a range from about 200 Angstroms to about 400 Angstroms. In some examples, second dielectric layer 82 comprises a boron doped silicon glass (BSG) having a boron weight percent in a range from about 3% to about 5% and a thickness in a range from about 400 Angstroms to about 600 Angstroms. Second dielectric layer 82 can be formed using CVD or similar techniques. After second dielectric layer 82 is formed, semiconductor device 10 can be annealed at a temperature of about 800 degrees Celsius to about 900 degrees Celsius. In a subsequent step, second dielectric layer 82 is removed using, for example, a buffered HF etch. In accordance with the present description, the selectively between first dielectric layer 81 and second dielectric layer 82 allows the selective removal of second dielectric layer 82 while leaving at least a portion of first dielectric layer 81 in place on semiconductor device 10. In some examples, first dielectric layer 81 and second dielectric layer 82 provide dielectric fill structure 27.

Figure 9:
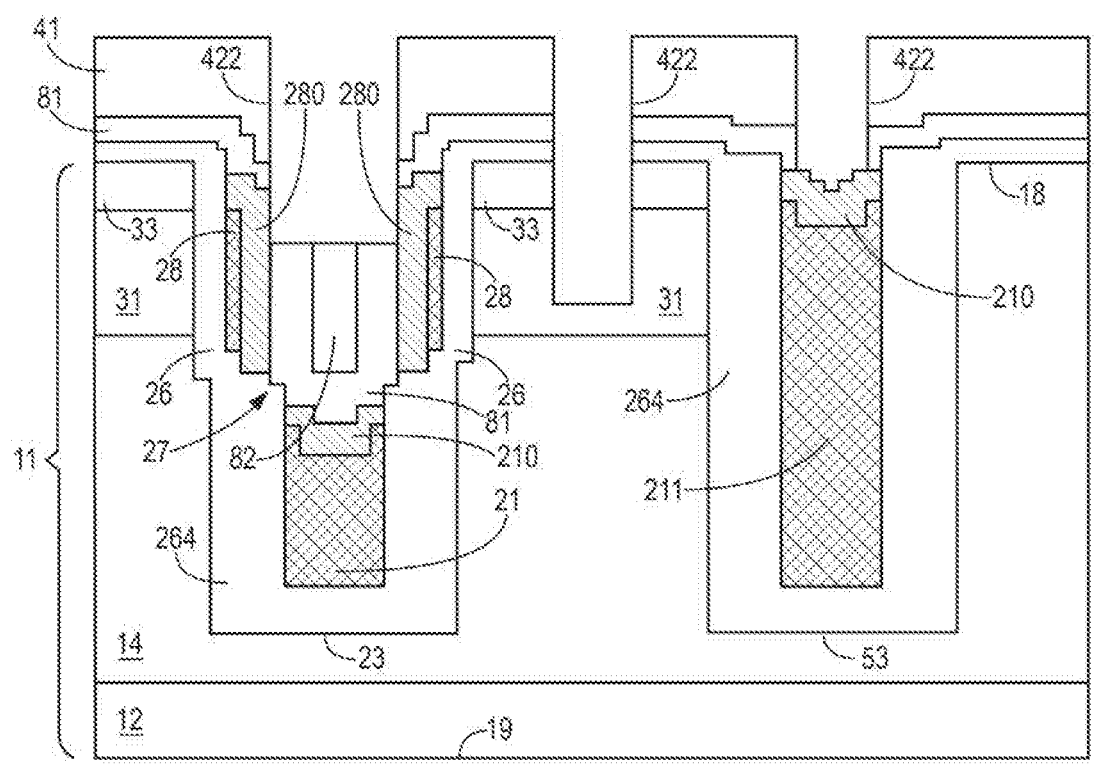

FIG. 9 illustrates a partial cross-sectional view of semiconductor device 10 after further processing. In some examples, ILD structure 41 is provided overlying semiconductor device 10. In some examples, ILD structure 41 comprises an undoped silicon glass (USG) layer having a thickness in a range from about 800 Angstroms to about 1000 Angstroms and a phosphorous doped silicon glass (PSG) layer having a thickness in a range from about 6000 Angstroms to about 8000 Angstroms. The PSG layer can have a phosphorous weight percentage in a range from about 3% to about 5%. ILD structure 41 can be formed using CVD or similar techniques. In some examples, ILD structure 41 can be annealed to densify the structure. In some examples, ILD structure 41 can be planarized using, for example, chemical mechanical planarization (CMP) techniques. Next contact opening 422 can be formed in ILD structure 41 and first dielectric layer 81 to provide for conductive regions 43 as described in conjunction with FIG. 1. In accordance with the present description, contact opening 422 within active trench 23 removes a portion of first dielectric layer 81 adjacent to gate conductive layers 280 so that conductive region 43 makes contact adjacent to side surfaces of gate conductive layers 280 as generally illustrated in FIGS. 1 and 9.

In some examples, a photo masking step and an ion implantation step can be used to form contact region 36 as described in conjunction with FIG. 1. In some examples, a conductive layer can be provided and patterned to provide conductive layers 44A and 44B, region of semiconductor material 11 can be thinned using back grinding or other techniques, and then conductive layer 46 provided adjacent to major surface 19.

Figure 10:
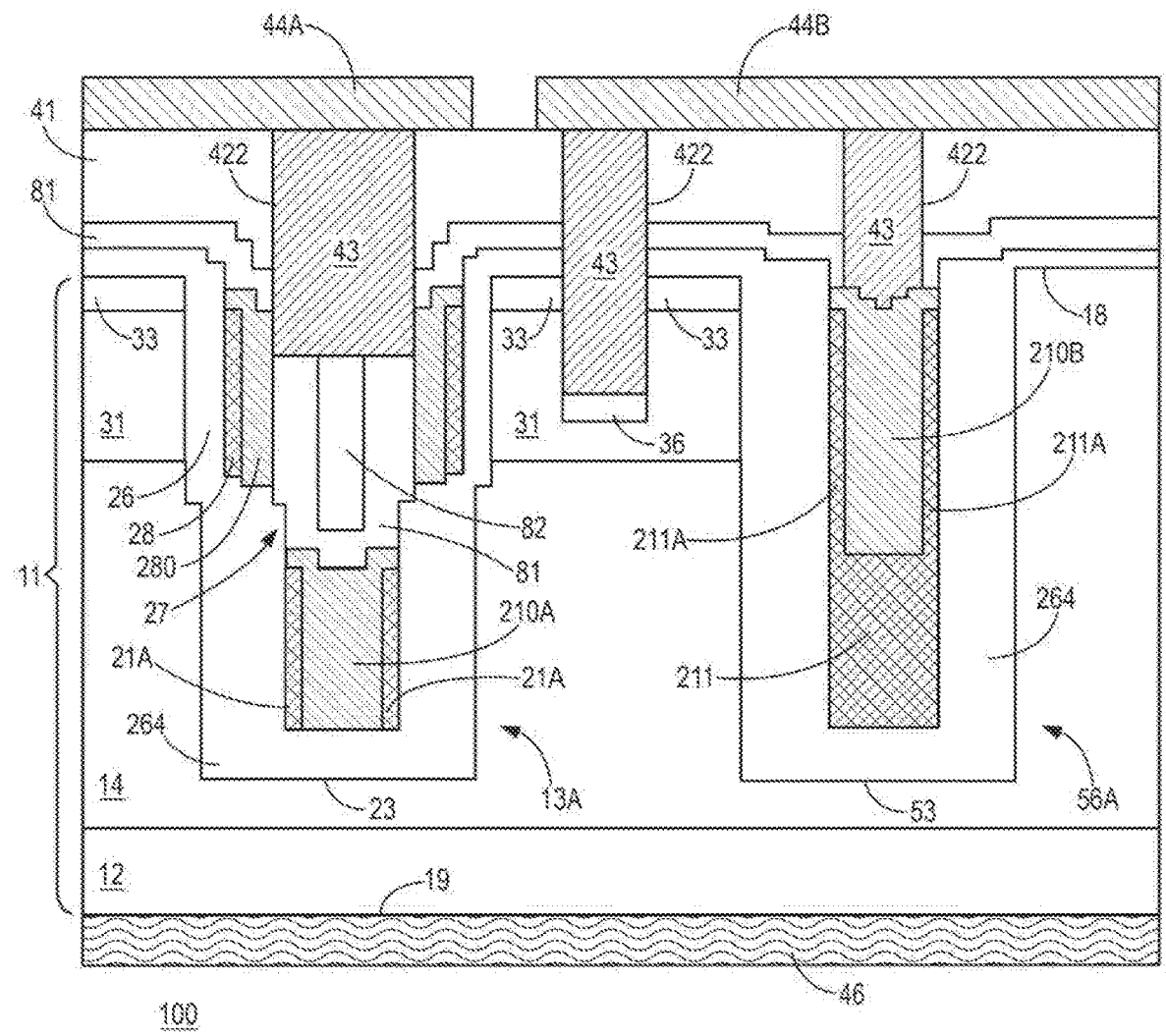
FIG. 10 illustrates a partial cross-sectional view of a semiconductor device of in accordance with the present description.

FIG. 10 illustrates an enlarged partial cross-sectional view of an electronic device 100, a semiconductor device 100, or a trench MOSFET 100 having a trench gate structure 13A in accordance with the present description. Trench gate structure 13A can be placed in an active region of semiconductor device 100. FIG. 10 also illustrates semiconductor device 10 with a shield contact structure 56A, which can be placed in the active region and/or a peripheral region of semiconductor device 100. Semiconductor device 100 is similar to semiconductor device 10 and the following description will focus on differences between the two devices.

Semiconductor device 100 has a shield electrode that comprises shield spacer electrodes 21A disposed adjacent to side wall surfaces of shield dielectric layer 264 in active trench 23. In addition, semiconductor device 100 includes shield conductive layer 210A, which extends up to the entire vertical depth of shield spacer electrodes 21A as generally illustrated in FIG. 10. In this way, shield conductive layer 210A contact more surface area of shield spacer electrodes 21A thereby lowering resistance in some examples. In some examples, shield conductive layer 210A substantially fills the gap between shield spacer electrodes 21A. In some examples, dielectric fill structure 27 can extend further into active trench 23 to fill any gap between portions of shield conductive layer 210A after silicide formation.

In semiconductor device 100, shield contact layer 211 further includes shield contact spacers 211A disposed adjacent to upper sidewall surfaces of shield dielectric layer 264 in contact trench 53. In this way, shield conductive layer 210B contacts shield contact spacers 211A along their depth thereby lowering resistance in some examples. In some examples, shield conductive layer 210B substantially fills the gap between shield contact spacers 211A. In other examples, conductive region 43 can extend further into contact trench 53 to fill any gap between portions of shield conductive layer 210B after silicide formation.

Figure 11:
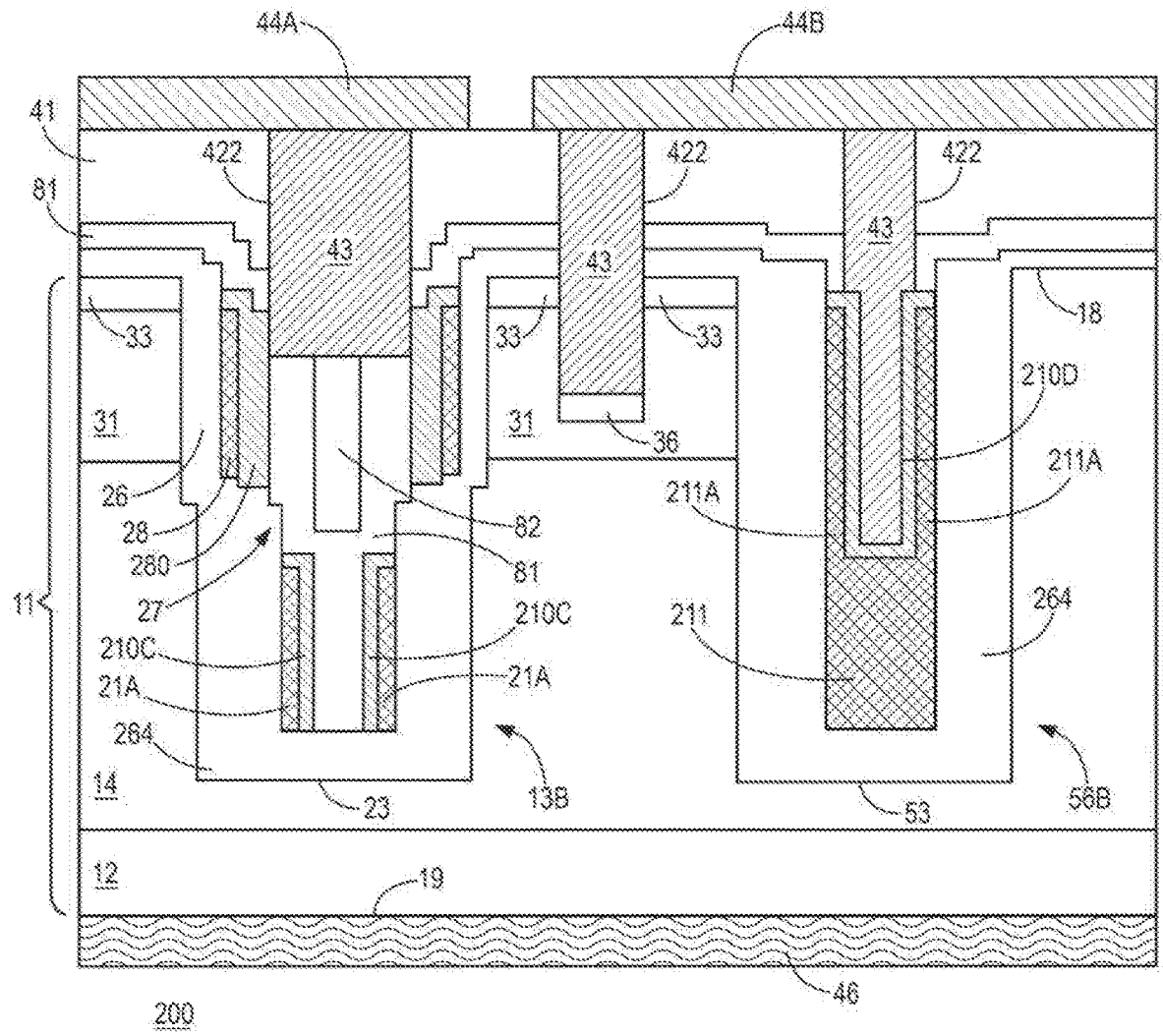
FIG. 11 illustrates a partial cross-sectional view of a semiconductor device in accordance with the present description.

FIG. 11 illustrates an enlarged partial cross-sectional view of an electronic device 200, a semiconductor device 200, or a trench MOSFET 200 having a trench gate structure 13B in accordance with the present description. Trench gate structure 13B can be placed in an active region of semiconductor device 200. FIG. 11 also illustrates semiconductor device 10 with a shield contact structure 56B, which can be placed in the active region and/or a peripheral region of semiconductor device 200. Semiconductor device 200 is similar to semiconductor device 10 and the following description will focus on differences between the two devices.

Semiconductor device 200 has a shield electrode that comprises shield spacer electrodes 21A disposed adjacent to side wall surfaces of shield dielectric layer 264. In addition, semiconductor device 200 includes shield conductive spacers 210C, which extend up to the entire vertical depth of shield spacer electrodes 21A as generally illustrated in FIG. 11. In this way, shield conductive spacers 210C contact more surface area of shield spacer electrodes 21A thereby lowering resistance in some examples. In the present example, dielectric fill structure 27 can extend further into active trench 23 to fill the gap between shield conductive spacers 210C after silicide formation.

In semiconductor device 200, shield contact layer 211 further includes shield contact spacers 211A disposed adjacent to upper sidewall surfaces of shield dielectric layer 264 in contact trench 53. In this way, shield conductive layer 210D contacts shield contact spacers 211A along their depth thereby lowering resistance in some examples. In some examples, shield conductive layer 210D is provided as a liner structure and, in some examples, conductive region 43 extends further into contact trench 53 to fill any gap between portions of shield conductive layer 210D after silicide formation.

In view of all of the above, it is evident that a novel structure and method are disclosed. Included, among other features, is a semiconductor device having a trench gate electrode structure and a shield electrode structure each comprising polycrystalline semiconductor material and one or more conductive material, such as a silicide. In some examples, the conductive material for the gate electrode structure and the shield electrode structure is provided during the same process steps. The structure and method provide semiconductor devices that have reduced shield and gate resistances, which improves, among other things switching performance and response time for driver inputs into the semiconductor device. In addition, the structure and method provide for the shield electrode resistance and the gate electrode resistance to be more closely matched. The reduced resistance enables a reduction in gate contact and shield contact structure requirements, which saves on die space. The structures and methods use materials and processes that are compatible in typical semiconductor wafer fabrication facilities and are manufacturable at low costs.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art. For example, materials for the gate electrodes, shield electrodes, gate conductive layers, and shield conductive layers can comprise one or more materials. When a plurality of materials are used, the materials can be deposited in sequence to provide a laminated structure. In other examples, a first layer can be deposited and patterned (for example, a first spacer portion), and subsequent layers can be deposited and patterned in a similar manner Conductive materials for the gate and shield structures can include polycrystalline semiconductor materials, silicides, metals, metal-nitrides, metalloids, and other conductive materials as known to one of ordinary skill in the art. Various deposition techniques can be used for the materials, including CVD, PECVD, MOCVD, ALD as well as other deposition techniques known to one of ordinary skill in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device, comprising:
    a region of semiconductor material comprising a first major surface and a first conductivity type;
    a trench gate structure comprising:
        an active trench extending from the first major surface into the region of semiconductor material;
        a shield dielectric layer adjacent to a lower portion of the active trench;
        a shield electrode adjacent to the shield dielectric layer in the lower portion of the active trench, the shield electrode comprising a first polycrystalline semiconductor material;
        a gate dielectric layer adjacent to an upper portion of the active trench;
        a gate electrode adjacent to the gate dielectric layer in the upper portion of the active trench, the gate electrode comprising a second polycrystalline semiconductor material;
        a shield conductive layer adjacent to the shield electrode, the shield conductive layer comprising a first conductive material;
        a gate conductive layer adjacent to the gate electrode, the gate conductive layer comprising the first conductive material, wherein the shield conductive layer and the gate conductive layer are portions of the same conductive layer; and
        a dielectric fill structure in the active trench electrically isolating the gate electrode and the gate conductive layer from the shield electrode and the shield conductive layer;
    a body region of a second conductivity type opposite to the first conductive type in the region of semiconductor material extending from the major surface adjacent to the trench gate structure; and
    a source region of the first conductivity type in the body region adjacent to the trench gate structure.

2. The device of claim 1, further comprising:
    a shield contact structure comprising:
        a contact trench extending from the first major surface into the region of semiconductor material, the contact trench laterally spaced apart from the active trench; and
        a shield contact layer in the contact trench and electrically coupled to the shield electrode, the shield contact layer comprising a third polycrystalline semiconductor material, wherein the shield conductive layer connects to the shield contact layer in the contact trench, and wherein, the shield conductive layer is a continuous layer between the active trench and the contact trench, and wherein the shield dielectric layer is disposed between the region of semiconductor material and the shield contact layer.

3. The device of claim 2, wherein:
the shield contact layer comprises shield contact spacers disposed adjacent to upper sidewall surfaces of the shield dielectric layer.

4. The device of claim 1, wherein:
the first conductive material comprises one or more of a metal material or a silicide material.

5. The device of claim 1, wherein:
the gate electrode comprises a first spacer structure proximate to a first side of the active trench and a second spacer structure proximate to a second side of the active trench;
the second side is opposite to the first side in a cross-sectional view; and
the dielectric fill structure is interposed between the first spacer structure and the second spacer structure in the cross-sectional view.

6. The device of claim 5, wherein:
the gate conductive layer comprises a first portion over the first spacer structure and a second portion over the second spacer structure;
the dielectric fill structure is interposed between the first portion and the second portion in the cross-sectional view;
the first portion contacts a top side and a lateral side of the first spacer; and
the second portion contacts a top side and a lateral side of the second spacer.

7. The device of claim 1, wherein:
the dielectric fill structure comprises:
   a first dielectric layer adjacent to the gate conductive layer and the shield conductive layer;
   a second dielectric layer adjacent to the first dielectric layer; and
   the first dielectric layer and the second dielectric layer are different materials.
8. The device of claim 7, wherein:
the first dielectric layer comprises an undoped silicon glass; and
the second dielectric layer comprises doped silicon glass.
9. The device of claim 1, wherein:
the shield electrode comprises:
   a first shield spacer electrode disposed adjacent to a first sidewall surface of the shield dielectric layer; and
   a second shield spacer electrode disposed adjacent to a second sidewall surface of the dielectric layer; and
the shield conductive layer is disposed between the first shield spacer electrode and the second shield spacer electrode in a cross-sectional view.
10. The device of claim 9, wherein:
the shield conductive layer comprises:
   a first shield conductive spacer over the first shield spacer electrode, and
   a second shield conductive spacer over the second shield spacer electrode; and
a portion of the dielectric fill structure extends into the active trench between the first shield conductive spacer and the second shield conductive spacer in the cross-sectional view.
11. A semiconductor device, comprising:
a region of semiconductor material comprising a first major surface and a first conductivity type;
a trench gate structure comprising:
   an active trench extending from the first major surface into the region of semiconductor material;
   a shield dielectric layer adjacent to a lower portion of the active trench;
   a shield electrode adjacent to the shield dielectric layer, the shield electrode comprising a first polycrystalline semiconductor material;
   a gate dielectric layer adjacent to an upper portion of the active trench;
   a gate electrode adjacent to the gate dielectric layer in the upper portion of the active trench, the gate electrode comprising a second polycrystalline semiconductor material;
   a conductive layer comprising one or more of a metal or a silicide and having:
      a shield conductive layer portion adjacent to the shield electrode; and
      a gate conductive layer portion adjacent to the gate electrode; and
   a dielectric fill structure in the active trench electrically isolating the gate electrode and the gate conductive layer from the shield electrode and the shield conductive layer;
a body region of a second conductivity type opposite to the first conductive type in the region of semiconductor material extending from the major surface adjacent to the trench gate structure; and
a source region of the first conductivity type in the body region adjacent to the trench gate structure.

12. The device of claim 11, further comprising:
a shield contact structure comprising:
   a contact trench extending from the first major surface into the region of semiconductor material, the contact trench laterally spaced apart from the active trench; and
   a shield contact layer in the contact trench and electrically coupled to the shield electrode, the shield contact layer comprising a third polycrystalline semiconductor material, wherein the shield conductive layer portion is a continuous layer that connects to the shield contact layer in the contact trench, and wherein the shield dielectric layer is disposed between the region of semiconductor material and the shield contact layer.
13. The device of claim 11, wherein:
the gate electrode comprises a first spacer structure proximate to a first side of the active trench and a second spacer structure proximate to a second side of the active trench;
the second side is opposite to the first side in a cross-sectional view; and
the dielectric fill structure is interposed between the first spacer structure and the second spacer structure in the cross-sectional view.
14. The device of claim 11, wherein:
the shield electrode comprises:
   a first shield spacer electrode disposed adjacent to a first sidewall surface of the shield dielectric layer; and
   a second shield spacer electrode disposed adjacent to a second sidewall surface of the dielectric layer; and
the shield conductive layer is disposed between the first shield spacer electrode and the second shield spacer electrode in a cross-sectional view.
15. The device of claim 14, wherein:
the shield conductive layer comprises:
   a first shield conductive spacer over the first shield spacer electrode, and
   a second shield conductive spacer over the second shield spacer electrode; and
a portion of the dielectric fill structure extends into the active trench between the first shield conductive spacer and the second shield conductive spacer in the cross-sectional view.
16. The device of claim 11, wherein:
the dielectric fill structure comprises:
   a first dielectric layer adjacent to the gate conductive layer and the shield conductive layer;
   a second dielectric layer adjacent to the first dielectric layer; and
   the first dielectric layer and the second dielectric layer are different materials.
17. A method of forming a semiconductor device, comprising:
providing a region of semiconductor material comprising a first major surface and a first conductivity type;
providing a trench gate structure comprising:
   an active trench extending from the first major surface into the region of semiconductor material;
   a shield dielectric layer adjacent to a lower portion of the active trench;
   a shield electrode adjacent to the shield dielectric layer, the shield electrode comprising a first polycrystalline semiconductor material portion;
   a gate dielectric layer adjacent to an upper portion of the active trench;
   a gate electrode adjacent to the gate dielectric layer, the gate electrode comprising a second polycrystalline semiconductor material portion;

a shield conductive layer adjacent to the shield electrode, the shield conductive layer comprising a first material, wherein the first material comprises one or more of a metal or a silicide;
a gate conductive layer adjacent to the gate electrode, the gate conductive layer comprising the first material; and
a dielectric fill structure in the active trench electrically isolating the gate electrode and the gate conductive layer from the shield electrode and the shield conductive layer;

providing a body region of a second conductivity type opposite to the first conductivity type in the region of semiconductor material extending from the major surface adjacent to the trench gate structure; and providing a source region of the first conductivity type in the body region adjacent to the trench gate structure, wherein:

providing the trench gate structure comprises providing the shield conductive layer and the gate conductive layer in a single set of steps.

18. The method of claim 17, wherein:
providing the trench gate structure comprises providing the shield conductor and the gate conductor in a single set of steps; and
the first polycrystalline semiconductor material portion and the second polycrystalline semiconductor material portion are portions of the same polycrystalline semiconductor layer.

19. The method of claim 17, further comprising:
providing a shield contact structure comprising:
a contact trench extending from the first major surface into the region of semiconductor material, the contact trench laterally spaced apart from the active trench; and
a shield contact layer in the contact trench and electrically coupled to the shield electrode, the shield contact layer comprising a third polycrystalline semiconductor material, wherein the shield conductive layer connects to the shield contact layer in the contact trench, and wherein the shield dielectric layer is disposed between the region of semiconductor material and the shield contact layer.

20. The method of claim 17, wherein:
providing the gate electrode comprises:
providing a first spacer structure proximate to a first side of the active trench, and
providing a second spacer structure proximate to a second side of the active trench;
the second side is opposite to the first side in a cross-sectional view; and
the dielectric fill structure is interposed between the first spacer structure and the second spacer structure in the cross-sectional view.

* * * * *